United States Patent
Wei et al.

(10) Patent No.: US 8,247,265 B2
(45) Date of Patent: Aug. 21, 2012

(54) METHOD FOR MANUFACTURING OPTOELECTRONIC MEMORY DEVICE

(75) Inventors: Kung-Hwa Wei, HsinChu (TW);
Jeng-Tzong Sheu, HsinChu (TW);
Chen-Chia Chen, Changhua County (TW); Mao-Yuan Chiu, Hualien County (TW)

(73) Assignee: National Chiao Tung University, Hsin-Chu (TW)

( * ) Notice: Subject to any disclaimer, the term of this patent is extended or adjusted under 35 U.S.C. 154(b) by 0 days.

(21) Appl. No.: 13/350,657

(22) Filed: Jan. 13, 2012

(65) Prior Publication Data

US 2012/0112756 A1    May 10, 2012

Related U.S. Application Data

(62) Division of application No. 12/484,606, filed on Jun. 15, 2009, now Pat. No. 8,178,866.

(30) Foreign Application Priority Data

Aug. 26, 2008 (TW) ................................ 97132581 A

(51) Int. Cl.
*H01L 51/40* (2006.01)

(52) U.S. Cl. .............. 438/99; 438/22; 438/82; 438/725; 438/780; 257/E31.033; 257/E51.027; 977/742

(58) Field of Classification Search .................... 438/22, 438/82, 99, 725, 780; 257/E31.033, E51.027; 977/742
See application file for complete search history.

(56) References Cited

U.S. PATENT DOCUMENTS

| 2005/0133087 A1 | 6/2005 | Alivisatos et al. |
| 2005/0285161 A1 | 12/2005 | Kang et al. |
| 2009/0101206 A1 | 4/2009 | Diklich |

*Primary Examiner* — Andy Huynh
(74) *Attorney, Agent, or Firm* — Birch, Stewart, Kolasch & Birch, LLP

(57) ABSTRACT

The present invention provides an optoelectronic memory device, the method for manufacturing and evaluating the same. The optoelectronic memory device according to the present invention includes a substrate, an insulation layer, an active layer, source electrode and drain electrode. The substrate includes a gate, and the insulation layer is formed on the substrate. The active layer is formed on the insulation layer, and more particularly, the active layer is formed of a composite material comprising conjugated conductive polymers and quantum dots. Moreover, both of the source and the drain are formed on the insulation layer, and electrically connected to the active layer.

6 Claims, 6 Drawing Sheets

METHOD FOR MANUFACTURING OPTOELECTRONIC MEMORY DEVICE

CROSS REFERENCE TO RELATED APPLICATIONS

This application is a Divisional of U.S. patent application Ser. No. 12/484,606 filed on Jun. 15, 2009, now U.S. Pat. No. 8,178,866 which claims priority to Application No. 097132581 filed in Taiwan, on Aug. 26, 2008. The entire contents of all of the above applications are hereby incorporated by reference.

FIELD OF THE INVENTION

The present invention relates to an optoelectronic device, its manufacturing method and measurement method, more specifically, the present invention relates to a polymer optoelectronic memory device that is doped with quantum dot, its manufacturing method and measurement method.

BACKGROUND OF THE INVENTION

In the prior art memory device with organic optically sensitive field effect transistor structure, some of the carriers will be stored in between the active layer and the dielectric layer after light illumination; therefore, in order to let carries be stored at the interface stably, the gate voltage needs to be applied so as to maintain memory time, but this will consume additional power. On the contrary, if the gate electrode voltage is not applied, carriers on the interface will combine quickly with the majority carriers in the active layer and get disappeared, hence, the device will lose the memory function and it is thus not suitable to be applied in general portable product.

For example, the optoelectronic memory having optically conductive film as of U.S. Patent No. 20060278866, which uses optically sensitive film as dynamic random access memory, hence, after each signal reading, carrier needs to be supplied.

Nano tube optoelectronic memory device as disclosed in U.S. Pat. No. 5,327,373 uses nano carbon tube as field effect transistor, and then the optical sensitive film is coated on the carbon tube surface. Since nano carbon tube has both the characteristics of metal and semiconductor, hence, according to the current technology, it is still difficult to separate semiconductor and metal nano carbon tube; but if metallic carbon nano tube is used as field effect transistor, the memory characteristic itself will be lost.

In U.S. Pat. No. 6,992,322, optically reactive type organic field effect transistor is disclosed, which uses organic thin film as the field effect transistor; moreover, when different gate electrode voltages are applied, the effects on the response time and memory time to light are discussed. However, the result as disclosed in the embodiment of the patent shows a very short memory time (<60 seconds).

SUMMARY OF THE INVENTION

The first scope of the present invention is to provide an optoelectronic memory device having longer memory time, easier manufacturing process and low cost.

According to one embodiment of the present invention, the optoelectronic memory device includes a substrate, an insulation layer, an active layer, a source electrode and a drain electrode. The substrate includes a gate electrode. The insulation layer is formed above the substrate, and the active layer, the source electrode and the drain electrode are all formed above the insulation layer. More specifically, the active layer is formed by a composite material made up of a conjugated polymer material and a quantum dot material. In addition, the source electrode is electrically connected to the active layer, and the drain electrode is electrically connected to the active layer.

The second scope of the present invention provides a method for manufacturing the above mentioned optoelectronic memory device.

According to one embodiment of the present invention, the method further comprising of the following steps: First, a substrate is formed, which includes a gate electrode. Next, an insulation layer is formed on the substrate, then a source electrode and a drain electrode are formed respectively on the insulation layer. Finally, a composite material is coated on the insulation layer so as to form an active layer, wherein the composite material further comprising of a conjugated polymer material and a quantum dot material. Please notice that in practice, the order of those steps can be changed according to the real situation and it is not necessary to follow the order as listed here.

The third scope of the present invention is to provide a method for measuring the above mentioned optoelectronic memory device.

According to one embodiment of the present invention, the method includes the following steps: First, the source electrode is grounded, then a drain electrode voltage is applied onto the drain electrode and a first current is measured at the drain electrode. Next, use an optical source to illuminate the optoelectronic memory device and measure a second current at the drain electrode. Finally, compare the sizes of the first current and the second current so as to judge the functional parameter of the optoelectronic memory device. During the real application, functional parameter can be, but is not limited to, for example, the storage time of memory, the memory window size, etc.

In addition, during the actual application and depending on the real situation, we can apply a gate electrode voltage through the gate electrode before the source electrode is grounded so as to deplete the active layer. In addition, after the completion of the above mentioned steps, we can, depending on the real situation, apply a pulse voltage so as to erase the memory state of the optoelectronic memory device.

The advantage and spirit of the present invention can be further understood through the following detailed descriptions of the invention and the drawings attached.

DETAILED DESCRIPTION OF THE INVENTION

The present invention provides an optoelectronic memory device, its manufacturing method and measurement method. In the followings, the embodiments and real application cases of the present invention are going to be described in details so as to describe fully the features, spirits and advantages of the present invention.

Figure 1:
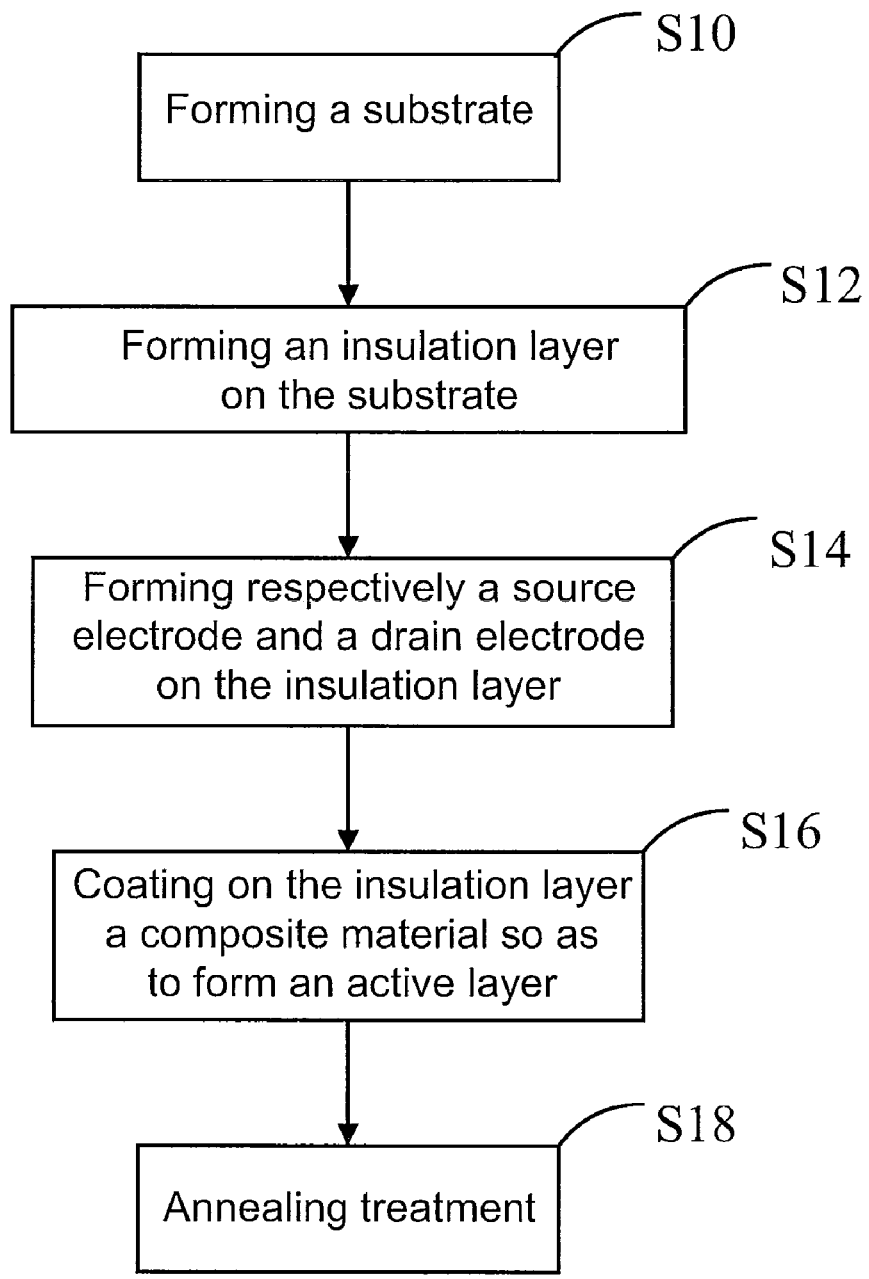
FIG. 1 illustrates the process flow of the method for manufacturing optoelectronic memory device according to one embodiment of the present invention.

Please refer to FIG. 1, which illustrates the process flow of the method for manufacturing optoelectronic memory device according to one embodiment of the present invention. As shown in the figure, the method can include the following steps:

Step S10 for forming a substrate which includes a gate electrode.

Step S12 for forming an insulation layer on the substrate. In practice, this step further comprising of the following two steps: (1) Forming a $SiO_2$ layer on the substrate; (2) Forming a Hexamethyldisilazone (HMDS) layer on the $SiO_2$ layer.

Step S14, forming respectively a source electrode and a drain electrode on the insulation layer.

Step S16, forming a composite material on the insulation layer so as to form an active layer. More specifically, the composite material includes a conjugated polymer material and a quantum dot material. In practice, when the insulation layer includes the HMDS layer, the source electrode, the drain electrode and the active layer are all formed above the HMDS layer.

Step S18, the carryout of annealing treatment. In practice, annealing treatment can be carried out under $N_2$ environment by aiming at active layer at 150° C. for continuous 5 minutes.

In one embodiment, the method for manufacturing optoelectronic memory device in the present invention can include the following steps:

First, dissolve polythiophene (P3HT) and CdSe quantum dot (with diameter 3.5±0.5 nm) into trichloro methane with a solution concentration of 5 mg/ml. Next, use n type silicon wafer (<0.005 Ωcm) to form substrate material and gate electrode; therefore, optoelectronic memory device manufactured by the present embodiment uses the following gate electrode structure.

Figure 2:
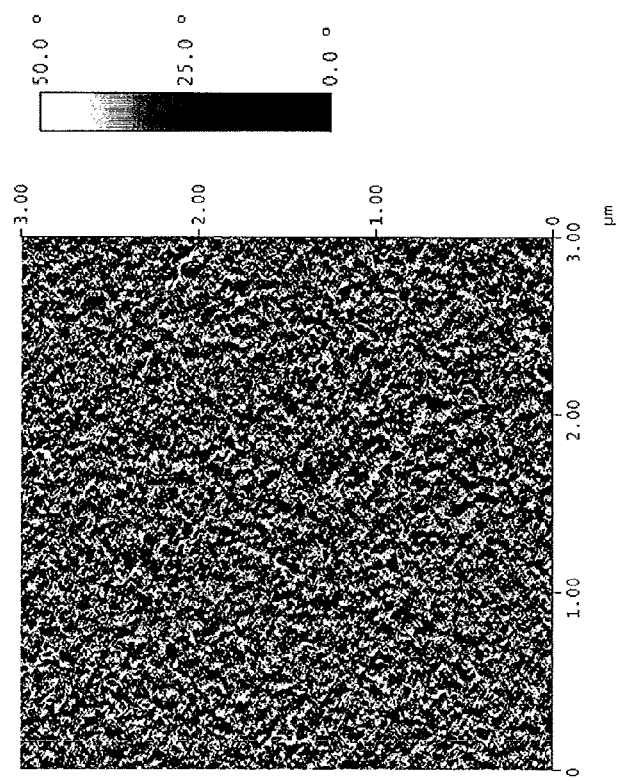
FIG. 2 illustrates the atomic microscope photo of polythiophene (P3HT) thin film that is doped with CdSe quantum dot according to the present invention.
Figure 2:
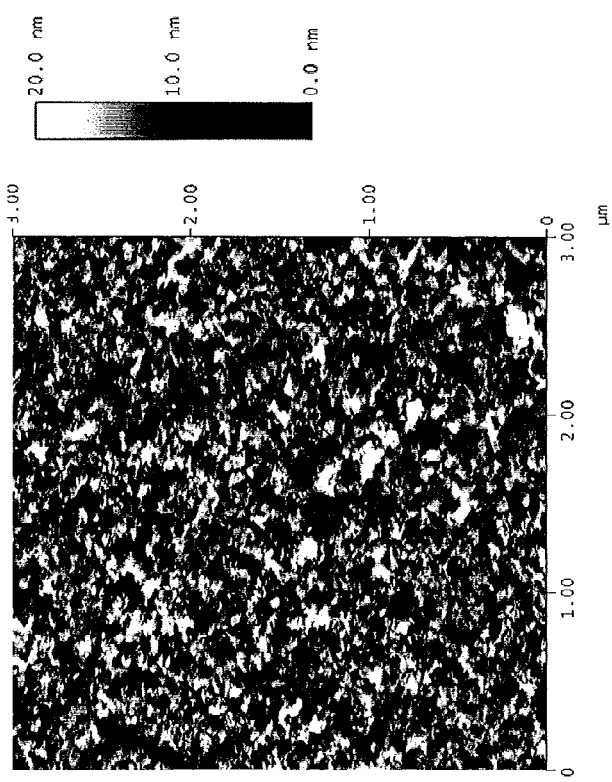

Later on, 900 Å of silicon dioxide is grown as dielectric layer, and vapor phase deposition method is used to prime HMDS on to the surface of silicon dioxide so as to form an insulation layer. Next, source electrode and drain electrode are formed above the insulation layer. Further next, spin coating method is used to deposit the prepared polythiophene (P3HT) and CdSe quantum dot solutions onto the insulation layer with thin film thickness about 100 nm. Finally, under $N_2$ environment, the thin film is annealed at 150° C. for continuous 5 minutes. Please refer to FIG. 2, which illustrates the atomic microscope photo of polythiophene (P3HT) thin film that is doped with CdSe quantum dot according to the present invention.

Figure 3:
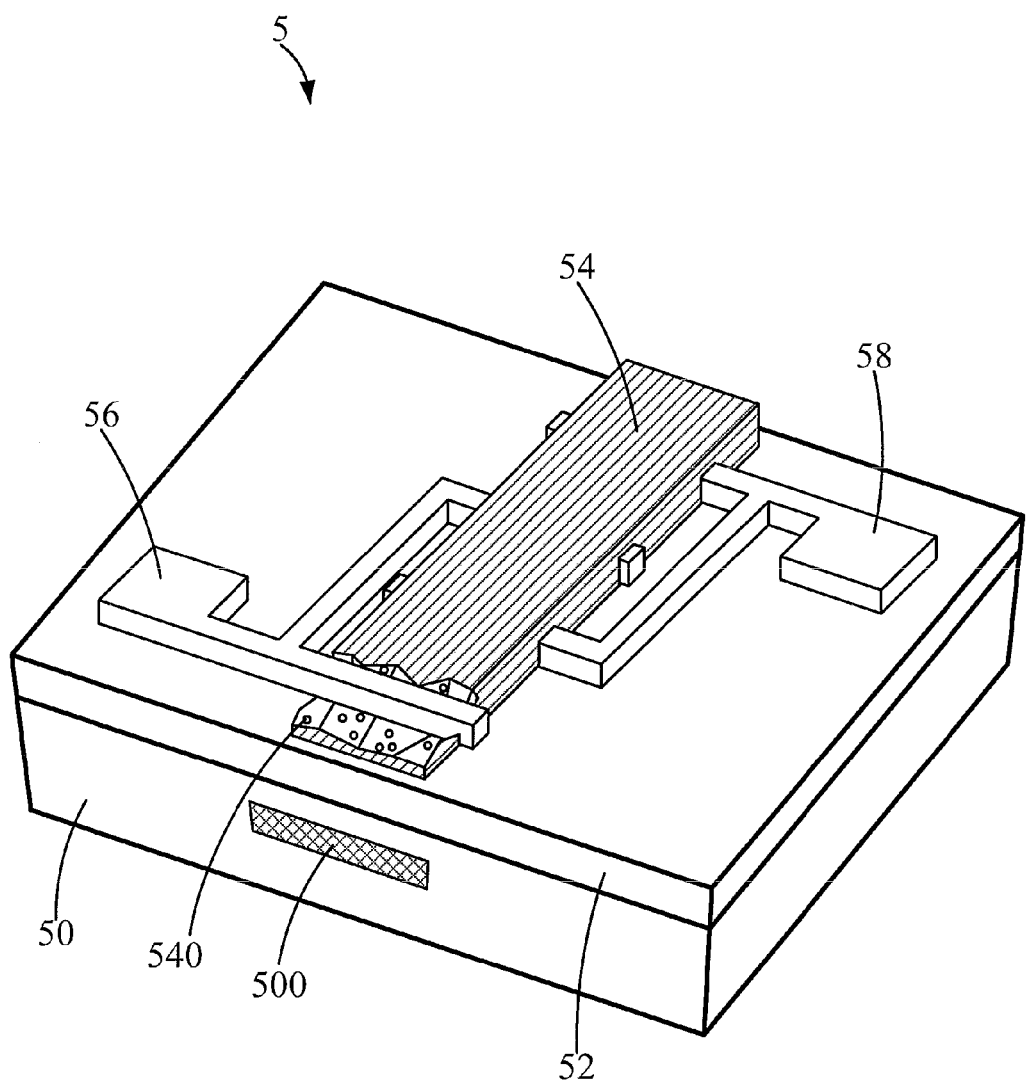
FIG. 3 illustrates the partial cross section of the optoelectronic memory device of one embodiment of the present invention.

Please refer again to FIG. 3, which illustrates the partial cross section of an optoelectronic memory device according to an embodiment of the present invention. As shown in the figure, the optoelectronic memory device 5 includes the substrate 50, the insulation layer 52, the active layer 54, the source electrode 56 and the drain electrode 58. Wherein the insulation layer 52 is formed above the substrate 50, and the active layer 54, the source electrode 56 and the drain electrode 58 are all formed above the insulation layer 52.

The substrate 50 includes a gate electrode 500 and the active layer 54 includes some quantum dots 540. In addition, the source electrode 56 and the drain electrode 58 are all connected to the active layer 54. In the current embodiment, the source electrode 56 and the drain electrode 58 all adopt finger shape electrodes and are arranged among the active layers 54 in staggered way. As described above, one of the features of the current invention is that the active layer 54 is formed by a composite material that includes conjugated polymer material and quantum dot 540.

In addition, in practice, the substrate 50 can be flexible and can be made up of Si, glass or other suitable materials. In addition, in practice, the insulation layer 52 can be made up of silicon dioxide, silicon nitride or other appropriate materials. As mentioned above, conjugated polymer material includes polythiophene (P3HT), moreover, quantum dot can be metal quantum dot or semiconductor quantum dot, for example, the above mentioned CdSe quantum dot, or other appropriate quantum dot.

Figure 4:
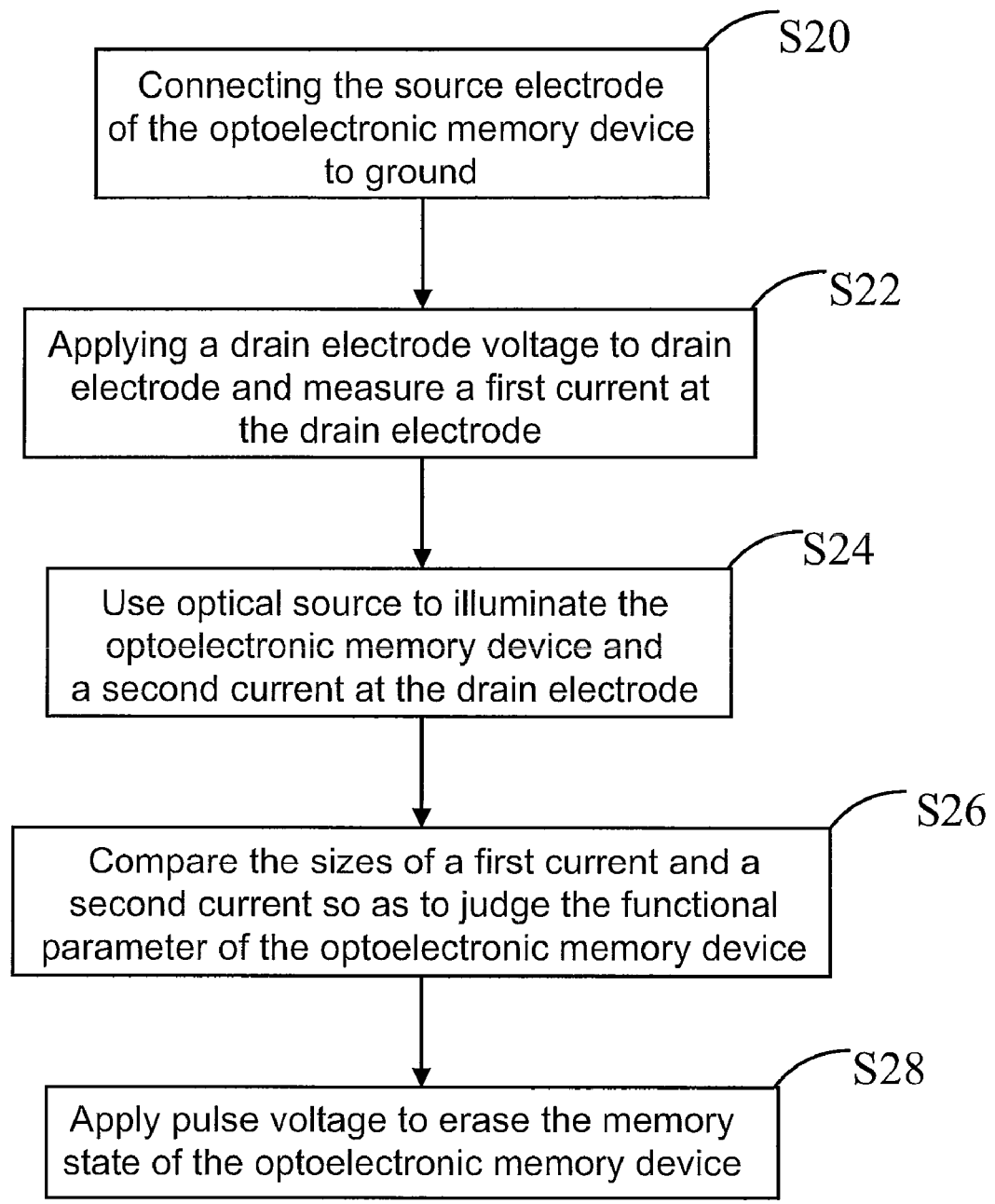
FIG. 4 illustrates the process flow of one embodiment of the present invention for measuring optoelectronic memory device.

As mentioned above, the present invention provides a method for measuring optoelectronic memory device. Please refer to FIG. 4, which illustrates the process flow of one embodiment of the present invention for measuring optoelectronic memory device. In this embodiment, the method is used to measure, as mentioned above, the optoelectronic memory device of the present invention. As shown in the figure, the method includes the following steps:

Step S20, is to ground the source electrode of the optoelectronic memory device.

Step S22, is to apply a drain electrode voltage on the drain electrode and to measure a first current at the drain electrode.

Step S24, is to use an optical source to illuminate the optoelectronic memory device and to measure a second current at the drain electrode.

Step S26, is to compare the sizes of the first current and the second current so as to judge the functional parameter of the optoelectronic memory device, for example, the storage time of the memory, the size of the memory window, etc.

Step S28, is to apply a pulse voltage to erase the memory state of the optoelectronic memory device.

Of course, in practice, the measurement method of the present invention can be used to measure other optoelectronic memory devices too.

Figure 5:
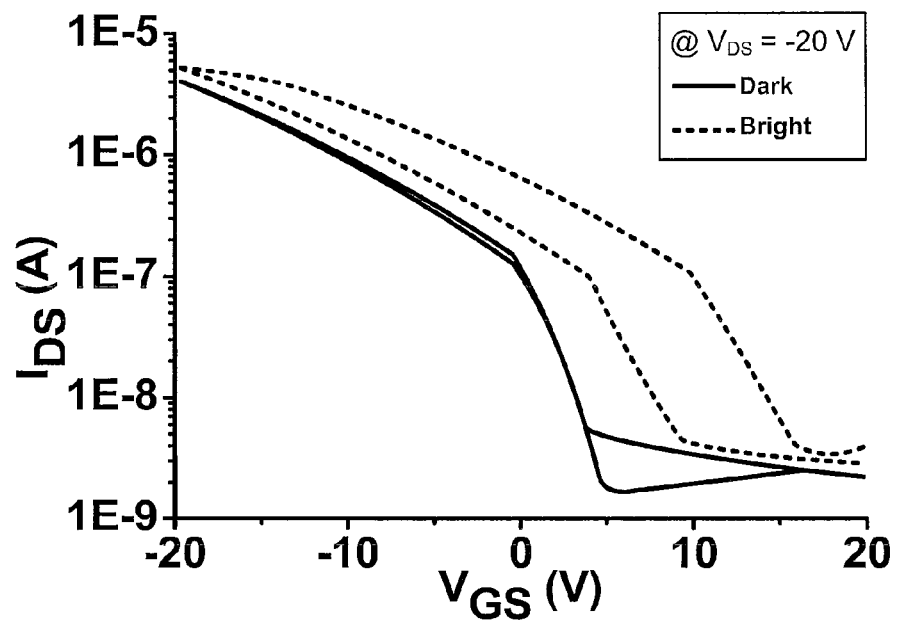
FIG. 5 which plots drain electrode to source electrode current $I_{DS}$ versus gate electrode to source electrode voltage $V_{GS}$ for the optoelectronic memory device of the present invention with the light illumination and without the light illumination.

Please refer to FIG. 5, which the plots drain electrode to the source electrode current $I_{DS}$ versus the gate electrode to the source electrode voltage $V_{GS}$ for the optoelectronic memory device of the present invention with the light illumination and without the light illumination. In other words, it is the characteristic transfer curve of the optoelectronic memory device of the present invention, wherein the drain electrode to the source electrode voltage $V_{DS}$ is −20V, and the device shows the characteristic of P type field effect transistor. As shown in the figure, the optoelectronic memory device of the present invention, under the light illumination, shows obvious hysteresis phenomenon, however, without the light illumination, the hysteresis phenomenon is not significant. The reason that the hysteresis phenomenon becomes more significant under the light illumination is mainly because that under the light illumination, the increase in the number of carriers in the active layer will make the catch of carriers easier at the interface of polythiophene (P3HT)-silicon dioxide or within silicon dioxide.

Figure 6:
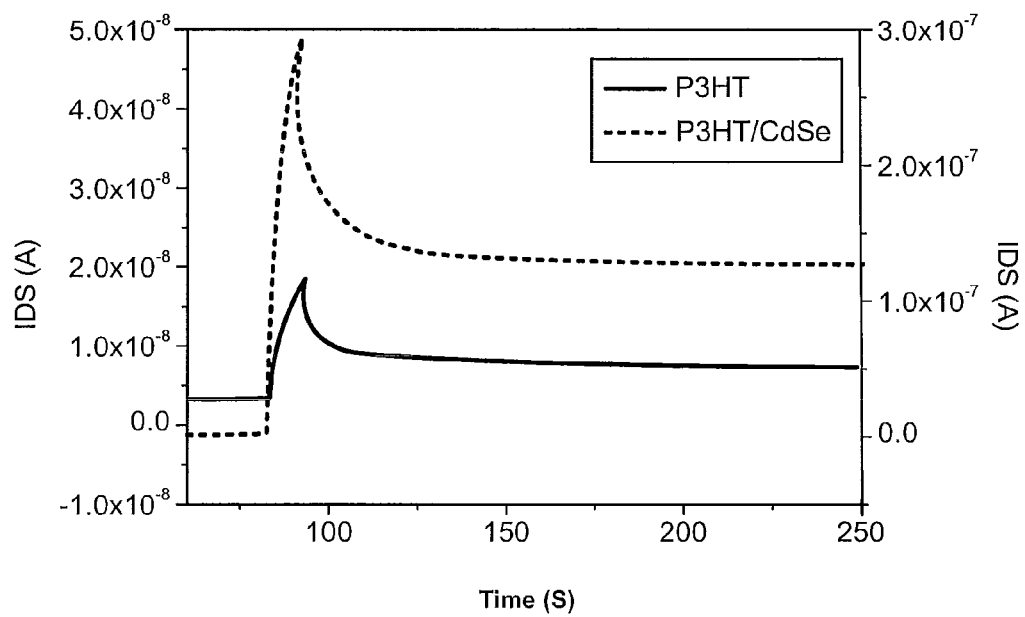
FIG. 6 illustrates the memory time test when the gate electrode of the optoelectronic memory device of the present invention is applied with a voltage of 15V.

Please refer to FIG. 6, which illustrates the memory time test when the gate electrode of the optoelectronic memory device of the present invention is applied with a voltage of 15V. As shown in the figure, when the impulse light source is turned on, the drain electrode current will rises quickly; moreover, the current of drain electrode that is doped with CdSe quantum dot device will have a larger change with the main reason due to effective separation of electron and hole caused by the built-in electric field between pure polythiophene (P3HT) and the doped CdSe quantum dot; when the impulse light source is turned off, the drain and source electrode currents of both devices will all reach stable states; in addition, device CdSe doped quantum dot device will have larger photo current/dark current ($I_{photo}/I_{dark}$) ratio, that is, the device memory window is larger.

Figure 7:
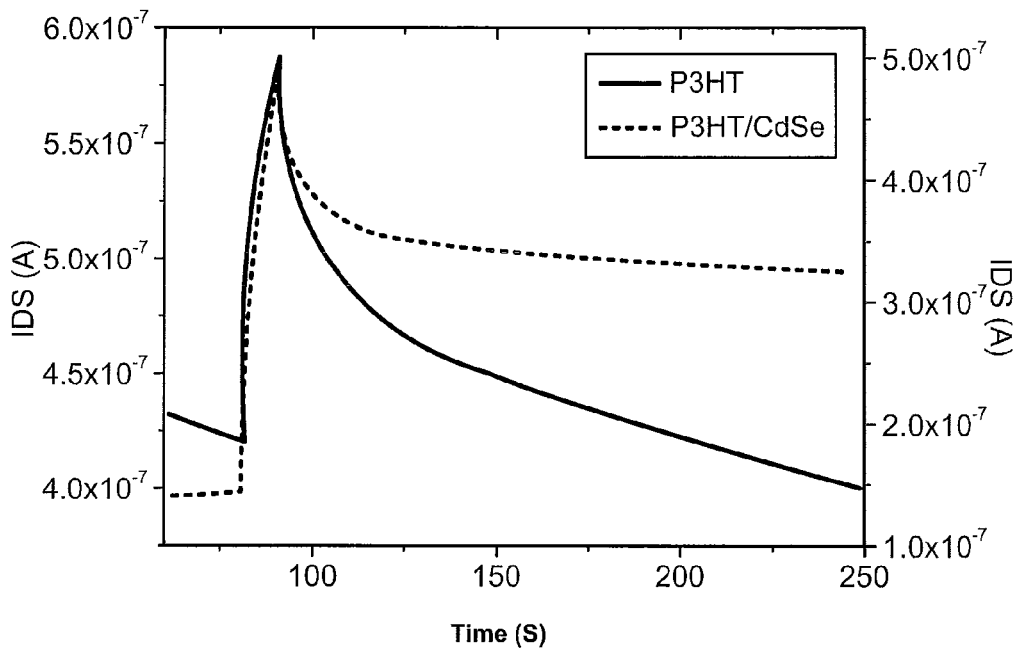
FIG. 7 illustrates the memory time test when the gate electrode of the optoelectronic memory device of the present invention is not applied with a voltage.

Please refer to FIG. 7, which illustrates the memory time test of the optoelectronic memory device of the present invention when the gate electrode is not applied with voltage. As shown in the figure, after the light is turned off for 100 seconds, since the current of pure polythiophene (P3HT) device will go back to the initial state, hence, when the gate electrode voltage is not applied, there is no external electric field to attract electrons. Therefore, the caught electrons will escape from this trap center, which will lead to the current reduction at the drain electrode of the pure polythiophene (P3HT) device. Relative to doped CdSe quantum dot device, under the light illumination, electrons, in addition to get stored in the interface of oxide layer, will get caught by CdSe quantum dot. Several minutes after the light excitation, the caught electrons will escape from this trap center. Relatively, within CdSe quantum dot, it is very difficult for electrons to jump back to polymers due to energy barrier. Even the bias on gate electrode does not exist, the stable state can stay for several hours.

Figure 8:
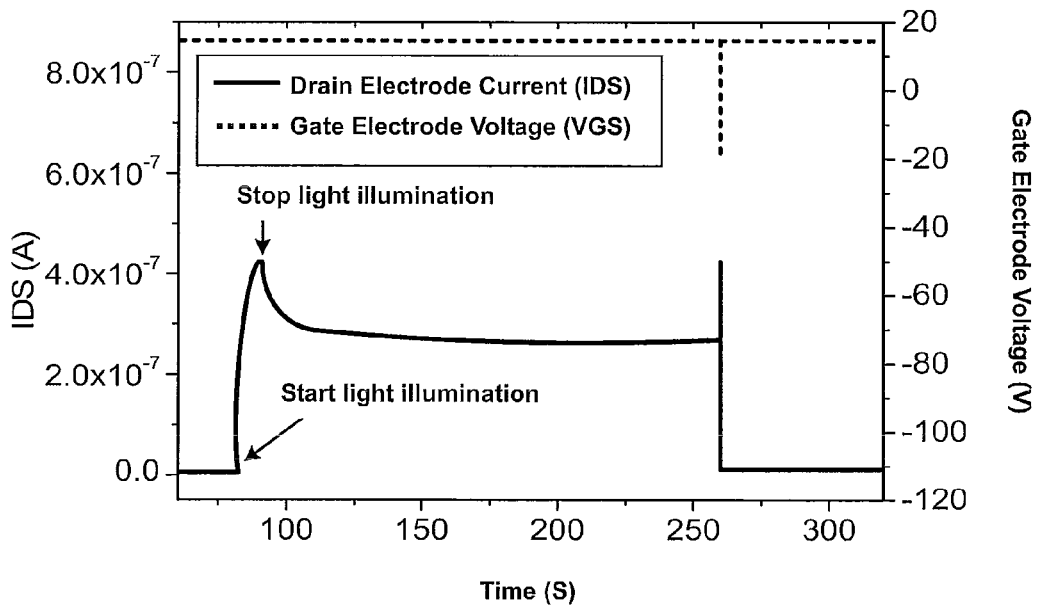
FIG. 8 illustrates the measurement of the current of the drain electrode for the optoelectronic memory device of the present invention with and without the light illumination.

Please refer to FIG. 8, which illustrates the measurement of the current of the drain electrode for the optoelectronic memory device of the present invention with and without the light illumination. As shown in the figure, after the light illumination, the drain electrode current of the optoelectronic memory device of the present invention will rise from 1.5 to 415 nA. Moreover, after the turnoff of the light source, the drain electrode current will drop slowly to a stable state. This stable state can be effectively removed through the use of pulse voltage (−15V, 100 ms). When the negative gate electrode impulse bias is applied, the caught electrons will recombine quickly with most of the electrons coming from the trap center; after the application of the negative electric field, the Fermi energy of CdSe quantum dot will be adjusted to conduction band, the build-in electric field will be reduced too, hence, electron-hole pair recombination will be reinforced. Under the basis of such operation model, we can operate the optoelectronic memory device quickly through the optical writing and the electrical erasing.

In practice, the above mentioned light source can be selected, according to the optical absorption spectrum characteristic of the active layer material, as white light, ultraviolet light, infrared or other appropriate light sources. In addition, during the actual application, when the composite material includes P type semiconductor material, the gate electrode voltage will be positive. On the contrary, when the composite material includes N type semiconductor, the gate electrode voltage will be negative.

To sum up, it can be seen that the optoelectronic memory device of the present invention uses quantum dot to be doped into conjugated conductive polymer material as the active layer, after the light illumination, electrons will be transferred to quantum dot and get stored within quantum dot, then after the application of appropriate gate electrode voltage, electrons will escape from quantum dot. Through the adoption of quantum dots of different sizes and different types of quantum dots or conjugated conductive polymers of different energy band gaps, the optical writing wavelengths of different devices can be improved. Moreover, through the use of quantum dots of different structures, the trap time of electrons in quantum dots can be increased, and the storage time of the memory can be enhanced too. In addition, the optoelectronic memory device of the present invention is much easier to be manufactured and much cheaper than conventional transistors.

Although the present invention is disclosed by better embodiment as above, yet it is not used to limit the scope of the present invention; anyone who is familiar with the prior art, without deviating the spirit and scope of the present invention, can make any kinds of changes and modifications; therefore, the protection scope of this invention, should rely on what is defined by "what is claimed" as attached below.

What is claimed is:

1. A method for manufacturing an optoelectronic memory device: comprising:
   (a) forming a substrate which includes a gate electrode;
   (b) forming an insulation layer above the substrate;
   (c) forming a source electrode and a drain electrode respectively on the insulation layer; and
   (d) coating a composite material on the insulation layer so as to form an active layer, wherein the composite material includes a conjugated polymer material and a quantum dot material;
   wherein the source electrode and the drain electrode are all electrically connected to the active layer, and the step of forming the gate electrode includes forming the entire gate electrode directly below the active layer and the insulation layer.

2. The method claim 1, further comprising:
   (e) under nitrogen environment, annealing the active layer at 150° C. for a continuous period of 5 minutes.

3. The method of claim 1, wherein the step (b) further includes:
   (b1) forming above the substrate a silicon dioxide layer; and
   (b2) forming a Hexamethyldisilazone (HMDS) layer above the silicon dioxide layer.

4. The method of claim 3, wherein the HMDS layer is formed by vapor phase deposition method on the silicon dioxide layer.

5. The method of claim 1, wherein the composite material is formed through the dissolution of polythiophene (P3HT) and CdSe quantum dot in trichloro methane.

6. The method of claim 1, wherein the step of forming the entire gate electrode directly below the active layer and the insulation layer includes forming the entire gate electrode directly below a top of the substrate.

* * * * *